(12) United States Patent
Raghunathan et al.

(10) Patent No.: US 8,911,920 B2
(45) Date of Patent: Dec. 16, 2014

(54) METHODS FOR FABRICATING EUV MASKS AND METHODS FOR FABRICATING INTEGRATED CIRCUITS USING SUCH EUV MASKS

(71) Applicant: GlobalFoundries, Inc., Grand Cayman (KY)

(72) Inventors: Sudharshanan Raghunathan, Guilderland, NY (US); Pawitter Mangat, Clifton Park, NY (US); Hui Peng Koh, Gansevoort, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 97 days.

(21) Appl. No.: 13/840,790

(22) Filed: Mar. 15, 2013

(65) Prior Publication Data

US 2014/0272677 A1 Sep. 18, 2014

(51) Int. Cl.
*G03F 1/44* (2012.01)
*G03F 1/22* (2012.01)
*G03F 7/20* (2006.01)

(52) U.S. Cl.
CPC ............... *G03F 7/2022* (2013.01); *G03F 1/22* (2013.01)
USPC ............................................. 430/5; 430/394

(58) Field of Classification Search
CPC ..................................... G03F 1/14; G03F 1/44
USPC ................................ 430/5, 311, 312, 313, 394
See application file for complete search history.

(56) References Cited

U.S. PATENT DOCUMENTS

2009/0169832 A1* 7/2009 Aton .......................... 428/195.1

\* cited by examiner

*Primary Examiner* — Stephen Rosasco
(74) *Attorney, Agent, or Firm* — Ingrassia Fisher & Lorenz, P.C.

(57) ABSTRACT

A method for fabricating integrated circuits includes fabricating an EUV mask by providing a photomask having a border region. A photoresist is formed over the photomask and has a border region overlying the border region of the photomask. The method exposes an inner portion and an outer portion of the photoresist border region. The method removes the inner portion and the outer portion to expose the border region of the photomask. The border region of the photomask is etched using the photoresist as a mask to form the EUV mask with a non-reflective border. The photoresist is removed from the EUV mask. The method includes forming another photoresist over a partially-fabricated integrated circuit layer and patterning the photoresist by exposure to EUV light reflected from the EUV mask to expose portions of the partially-fabricated integrated circuit layer. Portions of the partially-fabricated integrated circuit layer and the photoresist are removed.

20 Claims, 8 Drawing Sheets

METHODS FOR FABRICATING EUV MASKS AND METHODS FOR FABRICATING INTEGRATED CIRCUITS USING SUCH EUV MASKS

TECHNICAL FIELD

The technical field generally relates to lithography, and more particularly relates to methods for fabricating such EUV masks and methods for fabricating integrated circuits using such extreme ultraviolet (EUV) masks.

BACKGROUND

In conventional fabrication of semiconductor devices, semiconductor wafers are processed in batch, and a large number of complicated devices are formed on a single wafer. With rapid development of very large scale integration (VLSI), wafers are developed toward higher integration density and miniaturization. In the fabrication process, the critical dimensions of integrated circuits are further reduced as well, which raises a higher requirement for lithography processes. However, due to the restriction by the light source wavelength of conventional immersion scanners, conventional lithography cannot meet requirements of processes below 28 nm. In order to satisfy the requirements of processes below 28 nm, extreme ultraviolet (EUV) lithography techniques are used.

EUV lithography is an emerging technology utilizing extreme ultraviolet light to transfer a circuit layout pattern from a reflective EUV photomask (referred to herein as an "EUV mask" and also commonly referred to as a "reticle") to a semiconductor die. In one common implementation, the EUV mask includes a substrate, a multi-layer reflector formed over the substrate, and an absorber formed over the reflector. The reflector and the absorber are tuned to be predominately reflective and absorptive, respectively, of extreme ultraviolet light at a chosen EUV wavelength, such as about 13.5 nm. Utilizing conventional lithography, the absorber is patterned to expose selected areas of the underlying reflector corresponding to the desired circuit layout. The remaining portions of the absorber absorb the EUV radiation. During EUV lithography, EUV light is projected through a system of mirrors onto the EUV mask at a slight angle relative to the mask surface normal (commonly referred to as an "angular exposure" or "off-axis illumination"). Reticle masking blades or, more simply, "REMA" blades are commonly included in the exposure system to block the extra radiation outside the active semiconductor devices. The light impinging upon the REMA blades is primarily absorbed; while the light impinging upon the exposed regions of the reflector is primarily reflected from the EUV mask onto a layer of photoresist. The photoresist is utilized to impart the desired circuit layout to the semiconductor die. Leakage of EUV radiation occurs during exposure of adjacent dies. This primarily is caused by residual absorber reflectivity and REMA blade instability and out-of-band light reflections, resulting in over exposure around die edges.

Due to the angular exposure utilized during EUV lithography, a shadow effect occurs wherein small portions of the incoming and outgoing EUV light are inadvertently blocked by the upper sidewall edges of the absorber pattern. As the severity of the shadow effect varies in relation to orientation of the absorber pattern relative to the EUV light, the shadow effect results in a horizontal-to-vertical bias in critical dimensions. The shadow effect can be minimized by reducing the thickness or height of the absorber film; however, this also reduces the absorptivity of the absorber material. Furthermore, this effect is additionally magnified near the edges of the semiconductor die due to the positional inaccuracies of the REMA blades. Additional unwanted EUV light from the REMA blades may reflect an undesirably high amount (e.g., 2-3%) of EUV light at the selected wavelength, in addition to a certain amount of out-of-band light near the periphery of the semiconductor device. Image resolution may thus become blurred or undesirably diffuse at the outer edges of an exposure reflected from the EUV mask. When semiconductor dies are sequentially printed utilizing such an EUV mask, the dies may be overexposed multiple times along their neighboring edges resulting in uncontrolled variations in the critical dimensions.

One solution proposed to reduce the reflectivity of EUV masks along the regions surrounding the patterned area of the EUV mask forms a non-reflective or "black" border around the die pattern area. In this proposed solution, the reflector is physically removed along the die pattern border utilizing, for example, a plasma etch. While effectively eliminating reflectivity at the die pattern border, this solution requires precise removal of the border region, a relatively large area. Heretofore, EUV mask processing has not achieved sufficiently precise removal of the border region at acceptable processing rates, i.e., patterning or removal of the border of EUV masks presents a bottleneck in the EUV mask fabrication process.

Accordingly, it is desirable to provide embodiments of an improved extreme ultraviolet (EUV) mask fabrication process wherein the reflectivity of EUV light along the die pattern border is minimized by removing an EUV mask border region in a manner that requires relatively less time while providing sufficient precision. It would further be desirable to provide embodiments of a method suitable for fabricating an integrated circuit utilizing such an extreme ultraviolet (EUV) mask. Furthermore, other desirable features and characteristics will become apparent from the subsequent detailed description and the appended claims, taken in conjunction with the accompanying drawings and the foregoing technical field and background.

BRIEF SUMMARY

Methods for fabricating EUV masks and methods for fabricating integrated circuits using such EUV masks are provided. In one exemplary embodiment, a method for fabricating a portion of an integrated circuit includes fabricating an extreme ultraviolet (EUV) mask by providing a photomask substrate having a border region. A first photoresist is formed over the photomask substrate and has a border region overlying the border region of the photomask substrate. The method exposes an inner portion of the border region of the first photoresist and an outer portion of the border region of the first photoresist. The method removes the inner portion and the outer portion of the border region of the first photoresist to expose the border region of the photomask substrate. The border region of the photomask substrate is etched using the first photoresist as a mask to form the EUV mask with a non-reflective border. The first photoresist is removed from the EUV mask. The method includes forming a second photoresist over a layer of a partially-fabricated integrated circuit and patterning the second photoresist by exposure to EUV light reflected from the EUV mask to expose portions of the layer of the partially-fabricated integrated circuit. The method removes the portions of the layer of the partially-fabricated integrated circuit and the second photoresist.

In accordance with another embodiment, a method is provided for fabricating an EUV mask. The method provides a photomask substrate having a border region and forms a first photoresist over the photomask substrate. The first photoresist has a border region overlying the border region of the photomask substrate. A first portion of the border region of the first photoresist is removed to expose a first portion of the border region of the photomask substrate. The first portion of the border region of the photomask substrate is etched using the first photoresist as a mask. Then, a remaining portion of the first photoresist is removed. A second photoresist is formed over the photomask substrate and has a border region overlying the border region of the photomask substrate. A second portion of the border region of the second photoresist is removed to expose a second portion of the border region of the photomask substrate. The method etches the second portion of the border region of the photomask substrate using the second photoresist as a mask. A remaining portion of the second photoresist is then removed.

In another embodiment, a method for fabricating an EUV mask is provided. The method includes providing a photomask substrate having a border region adjacent a die pattern region. A photoresist is formed over the photomask substrate and has a border region overlying the border region of the photomask substrate. An inner portion of the border region of the photoresist is exposed to form an exposed portion no more than 30 nanometers (nm) from the die pattern region. Further, an outer portion of the border region of the photoresist is exposed. The inner portion of the border region of the photoresist is removed and the outer portion of the border region of the photoresist is removed to expose the border region of the photomask substrate. The method etches the border region of the photomask substrate using the photoresist as a mask to form the EUV mask with a non-reflective border no more than 30 nm from the die pattern region. Also, the method removes the photoresist from the photomask substrate.

BRIEF DESCRIPTION OF THE DRAWINGS

Embodiments of methods for fabricating EUV masks and methods for fabricating integrated circuits using such EUV masks will be described in conjunction with the following drawing figures, wherein like numerals denote like elements, and wherein.

DETAILED DESCRIPTION

The following detailed description is merely exemplary in nature and is not intended to limit the methods for fabricating integrated circuits or the methods for fabricating EUV masks claimed herein. Furthermore, there is no intention to be bound by any expressed or implied theory presented in the preceding technical field, background or brief summary, or in the following detailed description.

Methods for fabricating integrated circuits using EUV masks and methods for fabricating EUV masks as described herein avoid issues faced by current EUV masks. For example, lithography techniques using EUV masks often result in blurred or diffuse image resolution along the edges of exposures reflected from EUV masks. To avoid such poor image resolution, EUV masks are fabricated herein with an improved non-reflective border region using an acceptable processing schedule. Specifically, exemplary methods herein utilize a double patterning technique to provide highly precise patterning of an inner portion of the border region and a relatively fast patterning of a larger outer portion of the border region to facilitate efficient and precise formation of the non-reflective border region. As a result, the non-reflective border region is positioned within a selected distance of the die pattern region of the EUV mask, such as within about 30 nanometers (nm). Due to the precisely formed non-reflective border region, the EUV mask provides reduced image blurriness or diffusion during EUV lithography processing of an integrated circuit.

Figure 19:
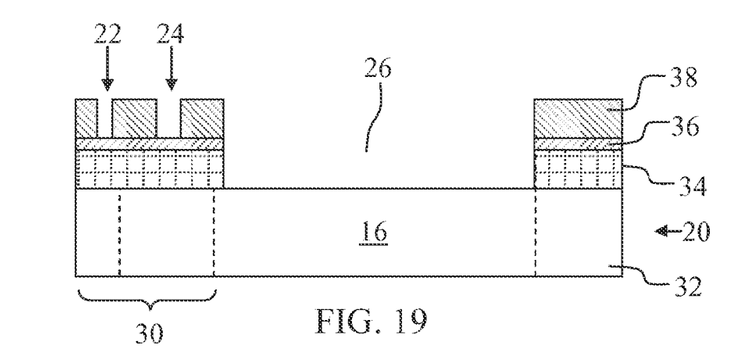
Figure 20:
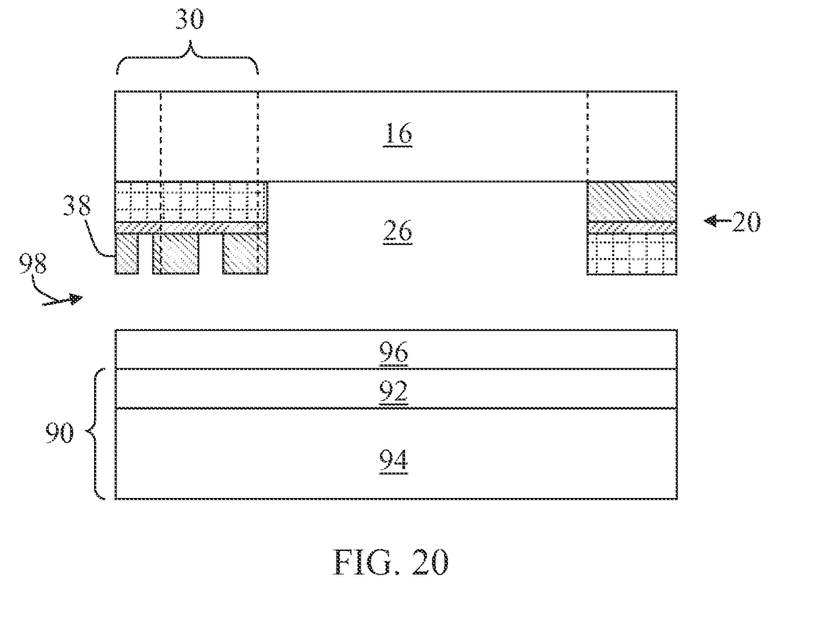
FIGS. 20-21 are simplified cross-sectional views illustrating lithographic processing of an integrated circuit using the EUV mask of FIG. 10 or 19 in accordance with an exemplary embodiment.
Figure 21:
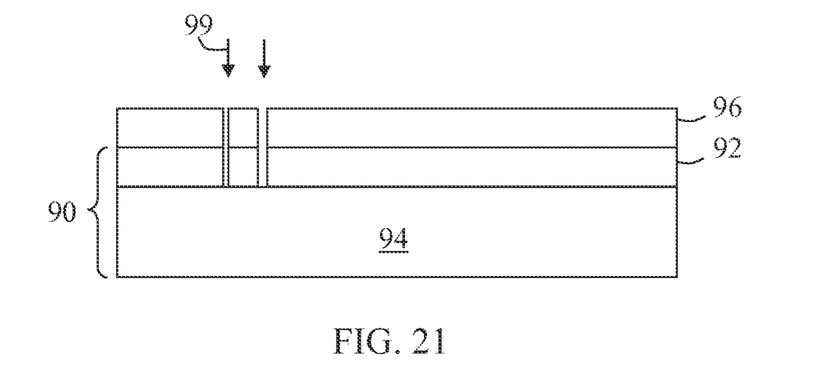

FIGS. 1-19 illustrate EUV masks and steps in accordance with various embodiments of methods for fabricating EUV masks. FIGS. 20-21 illustrate an exemplary method for fabricating integrated circuits using EUV masks. Various steps in the design and composition of EUV masks and integrated circuits are well known and so, in the interest of brevity, many conventional steps will only be mentioned briefly herein or will be omitted entirely without providing the known process details. Further, it is noted that EUV masks and integrated circuits include a varying number of components and that single components shown in the illustrations may be representative of multiple components.

Figure 1:
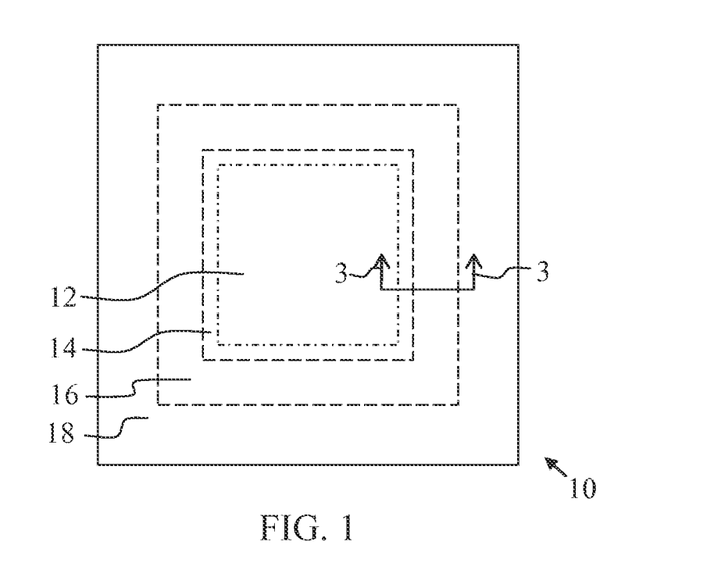
FIG. 1 is a top view of a photomask substrate blank for processing into an extreme ultraviolet (EUV) mask in accordance with an exemplary embodiment.

FIG. 1 illustrates a photomask substrate or blank 10. As shown, the photomask substrate 10 includes a square device or product region 12, a scribe line or kerf region 14 surrounding the product region 12, a border region 16 surrounding the scribe line region 14, and a periphery 18 surrounding the border region 16.

Figure 2:
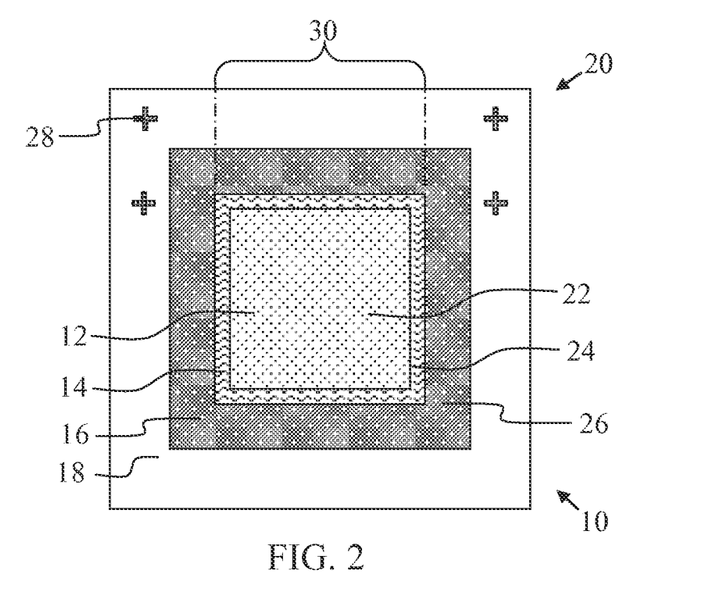
FIG. 2 is a top view of the photomask substrate blank of FIG. 1 after processing into an extreme ultraviolet (EUV) mask in accordance with an exemplary embodiment.

FIG. 2 illustrates the photomask substrate 10 of FIG. 1, after processing to form an extreme ultraviolet (EUV) mask 20 (also commonly referred to as a "reticle") in accordance with an exemplary embodiment. Specifically, a product pattern 22 is patterned in the product region 12, a service pattern 24 is patterned in the scribe line region 14, and a non-reflective pattern 26 is formed in the border region 16. Also, alignment marks 28 may be formed in the periphery 18 to check the accuracy of the EUV mask alignment with REMA blades (not shown).

The product pattern 22 typically includes a circuit layout pattern. The service pattern 24 typically contains important information regarding the photolithography process of the semiconductor substrate and may include test structures to verify the performance of the photolithography process. Further, service pattern 24 may include registration marks to measure the resolution of the device pattern during the photolithography process. Typically, after the photolithography process, the semiconductor substrate is diced into semiconductor chips through the scribe line region 14. The product region 12 and scribe line region 14 may be collectively referred to as a die pattern region 30 and they are typically patterned simultaneously.

EUV mask 20 is utilized in the performance of extreme ultraviolet lithography wherein extreme ultraviolet light, i.e., light having a wavelength of about 10 nm to about 14 nm, is utilized to transfer a circuit layout pattern from EUV mask 20 to a semiconductor die fabricated on a semiconductor wafer. The EUV wavelength selected for usage during EUV lithography will typically range from about 5 nm to about 15 nm and is preferably equivalent to about 13.5 nm. EUV mask 20 is imparted with the desired circuit layout by patterning of the product pattern 22, i.e., the region of EUV mask 20 where a desired circuit layout will be patterned. As will be described below, EUV mask 20 includes an absorber stack and a multi-layer reflector formed over the absorber stack. The absorber stack and multi-layer reflector are tuned to be predominately absorptive and reflective, respectively, of EUV light at the selected wavelength (e.g., about 13.5 nm). Patterning of a die pattern region 30 (also commonly referred to as the "quality die area") is achieved through the controlled removal of the absorber stack to expose selected areas of the underlying multi-layer reflector corresponding to the desired circuit layout. During lithographical processing of a semiconductor die, EUV light is directed against the patterned face of EUV mask 20 to illuminate an exposure field encompassing die pattern region 30. The exposed portions of the multi-layer reflector located within die pattern region 30 reflect, in substantial part, the EUV light impinging upon EUV mask 20 onto a photoresist layer deposited over a semiconductor die. Conventional lithographical techniques are then utilized to transfer the image from the photoresist to the semiconductor die. Depending upon the particular optical configuration of the photolithography system utilized during EUV lithography, die pattern region 30 may be several times (e.g., three to four times) larger than the quality die area of the semiconductor die where the desired circuit layout is ultimately transferred.

Figure 3:
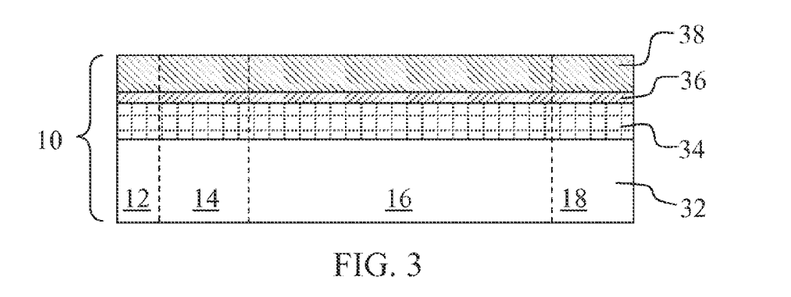
FIGS. 3-4 are simplified cross-sectional views illustrating processing of the photomask substrate of FIG. 1, taken along line 3-3 in FIG. 1, to form a product pattern and a service pattern in the respective product region and scribe line region in accordance with an exemplary embodiment.
Figure 4:
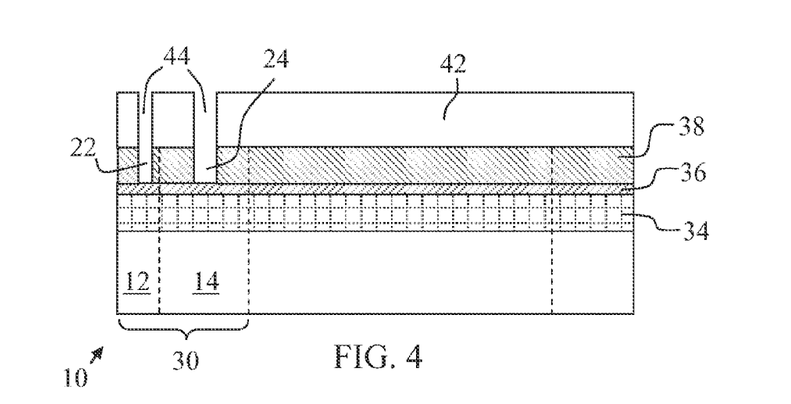

As noted above, conventionally-produced EUV masks tend to reflect undesirably high amounts of EUV light near the border of the die pattern area due, at least in part, to incomplete absorption of EUV light by the patterned absorber stack. To overcome this limitation and provide nearly complete absorption of the EUV light at the border region 16 surrounding the die pattern region 30, EUV mask 20 is fabricated to include an EUV non-reflective border pattern 26 (also referred to as a "black border") that extends at least partially around, and preferably fully circumscribes, die pattern region 30. As defined herein, the phrase "EUV non-reflective" or, more simply, "non-reflective" denotes a region or structure that reflects less than about 3% of incident light at a selected wavelength between about 5 and about 15 nm and, preferably, that reflects less than about 1% of incident light at a selected wavelength between about 13.4 and about 13.6 nm. Non-reflective border pattern 26 is formed through a double patterning process wherein an inner portion of the border region 16 adjacent the die pattern region 30 is exposed using a precise exposure process, and an outer portion of the border region 16 surrounding the inner portion is exposed using a faster, less precise, exposure process. The less precise process may be used as without detriment as it forms an exposed portion that overlaps with the precisely exposed portion. The exposed portions of the border region 16 are etched to remove the absorber stack and multi-layer reflector to form the non-reflective border pattern 26. Initial processing of the photomask substrate 10 to form product patterns and service patterns is illustrated in FIGS. 3 and 4. A first exemplary process for fabricating EUV mask 20 is described below in conjunction with FIGS. 5-10, and an additional exemplary process for fabricating an EUV mask having a non-reflective border is further described below in conjunction with FIGS. 11-19.

FIGS. 3-4 are simplified cross-sectional views of photomask substrate 10 (along line 3-3 in FIG. 1) illustrating formation of a product pattern and service a pattern in the respective product region and scribe line region. To commence the exemplary fabrication process, a photomask substrate 10 is obtained and includes a base substrate 32, a multi-layer reflector 34 formed over base substrate 32, an optional capping layer 36 formed over the reflector 34 (and which may be considered to be part of the reflector 34), and an absorber stack 38 formed over the reflector 34. Base substrate 32 is preferably fabricated from a material having a relatively low coefficient of thermal expansion, such as synthetic quartz. Although the thickness of base substrate 32 may vary, in one embodiment, base substrate 32 has a thickness of from approximately 5.0 to approximately 7.5 mm. In certain embodiments, a backside film can be formed over base substrate 32 opposite reflector 34; e.g., a chromium nitride film can be deposited over the backside of base substrate 32 to a thickness of, for example, about 70 nm.

Reflector 34 can include any number of layers formed from any material or group of materials, currently known or later developed, suitable for predominately reflecting incident EUV light at the selected wavelength (e.g., about 13.5 nm). In one common implementation, which has been shown to reflect about 64% of incident EUV light at about 13.5 nm, reflector 34 is fabricated to include a relatively larger number of alternating molybdenum and silicon layers. More specifically, and by way of non-limiting example, reflector 34 can be fabricated to include approximately forty pairs of Mo/Si layers. Alternatively, other bilayer stacks can be used to reflect light in the region of wavelength interest. In this exemplary case, the alternating Mo and Si layer can each have a thickness of about 2.78 nm and about 4.17 nm, respectively. In certain embodiments, reflector 34 is capped with a capping layer 36 (e.g., ruthenium) having a thickness of from about 1 nm to about 3 nm to help protect the alternating Mo/Si layers from any chemical etchants applied to the photomask substrate 10 during mask processing.

Absorber stack 38 can include any number of layers formed from any material or group of materials, currently known or later developed, suitable for predominately absorbing incident EUV light at the selected wavelength (e.g., about 13.5 nm). The absorptivity of absorber stack 38 will vary in conjunction with thickness and composition; however, it is noted that, in embodiments wherein absorber stack 38 is fabricated to be relatively thin to reduce shadow effects and minimize horizontal-to-vertical bias in critical dimensions, absorber stack 38 may absorb approximately 97-98% of incident EUV light at the selected wavelength (e.g., about 13.5 nm). In many embodiments, absorber stack 38 will include a plurality of tantalum-comprising layers. More specifically, and as a first example, absorber stack 38 may include a tantalum boron nitride (TaBN) layer and an overlying tantalum boron oxide (TaBO) layer. In a thick configuration, the TaBN and TaBO layers may be deposited to thicknesses of, for example, about 56 nm and about 14 nm, respectively. In a thin configuration, the TaBN and TaBO layers may be deposited to thicknesses of, for example, about 36 nm to about 58 nm and about 2 nm, respectively. In certain embodiments, a capping layer of chromium nitride may be formed over the TaBO layer having a thickness of, for example, 10 nm. As a second example, absorber stack 38 includes a tantalum nitride (TaN) layer and an overlying tantalum oxide (TaO) layer. In a thick configuration, the TaN and TaO layers may be deposited to thicknesses of, for example, about 77 nm and about 7 nm, respectively. In a thin configuration, the TaN and TaO layers may be deposited to thicknesses of, for example, about 36 nm to about 51 nm and about 7 nm, respectively. Extreme ultraviolet photomask substrates of the type described above are commercially available from Asahi Glass Co., Ltd., currently headquartered in Tokyo, Japan; and from Hoya Corporation also currently headquartered in Tokyo, Japan.

As shown in FIG. 4, a die pattern region 30 (including product region 12 and scribe line region 14) of photomask substrate 10 is imparted with a desired circuit layout as product pattern 22 and testing structures as service pattern 24 utilizing conventional lithographical processing. Specifically, as illustrated in FIG. 4, a photoresist 42 is deposited over the upper surface of absorber stack 38. Photoresist 42 is then exposed to an image pattern and treated with a developing solution to form pattern openings 44 within photoresist 42, as illustrated in FIG. 4. An anisotropic dry etch, such as a reactive ion etch, is performed utilizing a chemistry selected to etch absorber stack 38 to remove the areas of absorber stack 38 exposed through pattern openings 44. As a result, patterns 22 and 24 are created within absorber stack 38 and expose selected regions of reflector 34, or capping layer 36 if used.

At this juncture in the fabrication process, EUV mask 20 (and, more specifically, die pattern region 30) has been imparted with the desired product pattern 22 and service pattern 24 through the controlled removal of selected regions of absorber stack 38. Additional processing steps are now performed to form a non-reflective border pattern 26 in the border region 16 adjacent the die pattern region 30.

Figure 5:
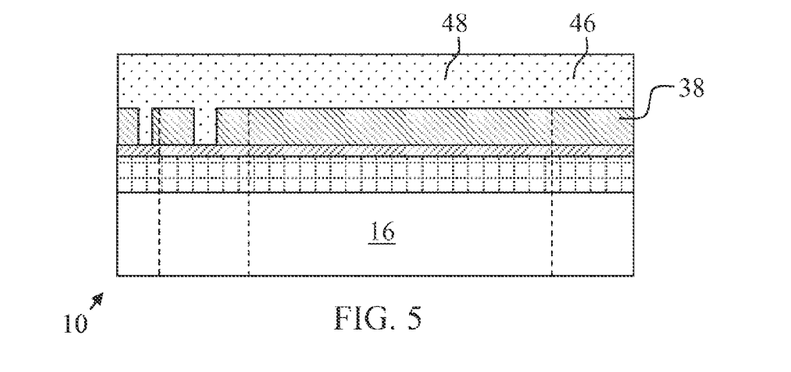
FIGS. 5-10 are simplified cross-sectional views illustrating processing of the photomask substrate of FIG. 4 at various stages of fabrication and illustrated in accordance with an exemplary embodiment of the EUV mask fabrication process wherein the non-reflective border region is formed with a single etch in the border region.

FIGS. 5-9 are simplified cross-sectional views of the photomask substrate 10 of FIG. 4 at various stages of manufacture and illustrated in accordance with a first exemplary embodiment of an EUV mask fabrication process wherein a EUV non-reflective border is formed using a double patterning and single etch process, i.e., a lithography-lithography-etch (LLE) process. With reference to FIG. 5, a photoresist 46 is formed over the upper surface of absorber stack 38 and includes a border region 48 overlying the border region 16 of the photomask substrate 10.

Figure 6:
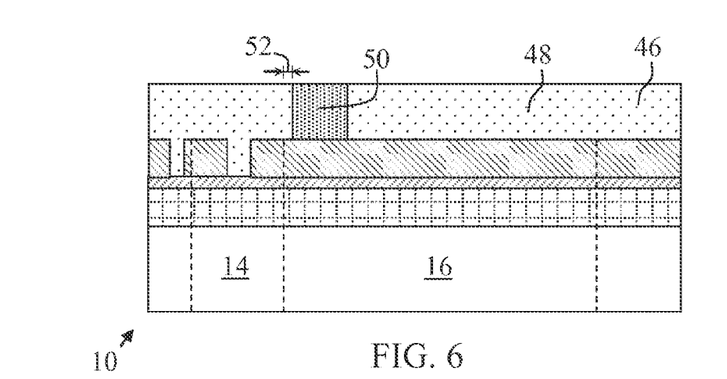

In FIG. 6, photoresist 46 is selectively exposed using a precise exposure process, such as an electron beam lithography process. As a result, an exposed inner portion 50 is formed in the border region 48 of the photoresist 46. The precise exposure process provides for formation of the exposed inner portion 50 with a deviation of no more than about ±15 nm. As a result, the exposed inner portion 50 can be formed at a distance 52 from the scribe line region 14 of no more than about 30 nm. In certain embodiment, the exposure process has a deviation of no more than about ±10 nm and the exposed inner portion 50 is formed at a distance 52 from the scribe line region 14 of no more than about 20 nm.

Figure 7:
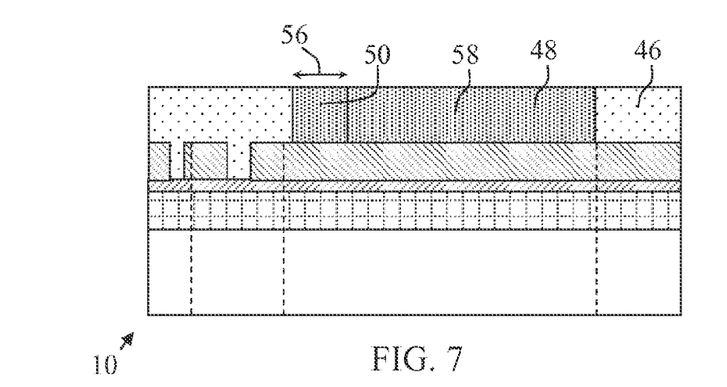

Referring to FIG. 7, the exposed inner portion 50 has a width 56. In an exemplary embodiment, the width 56 is at least about 60 nm. As further shown in FIG. 7, a second lithography process is performed to expose an outer portion 58 of the border region 48 of the photoresist 46. An exemplary lithography process is less precise than the process for exposing the inner portion 50, but is faster. For example, an optical lithography process, a direct laser writing lithography process, or a deep ultraviolet laser writing lithography process may be performed to expose the outer portion 58. Typically, the less precise lithography process has a deviation of about ±45 nm. However, the formation of the outer portion 58 is largely unaffected by the less precise process, as the process may overlap with the inner portion 50.

Figure 8:
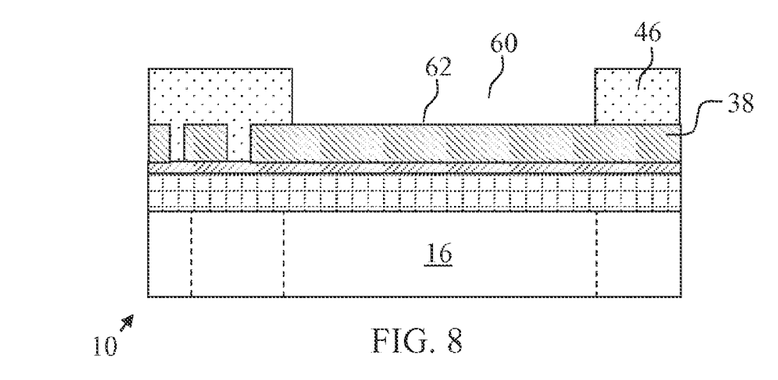
Figure 9:
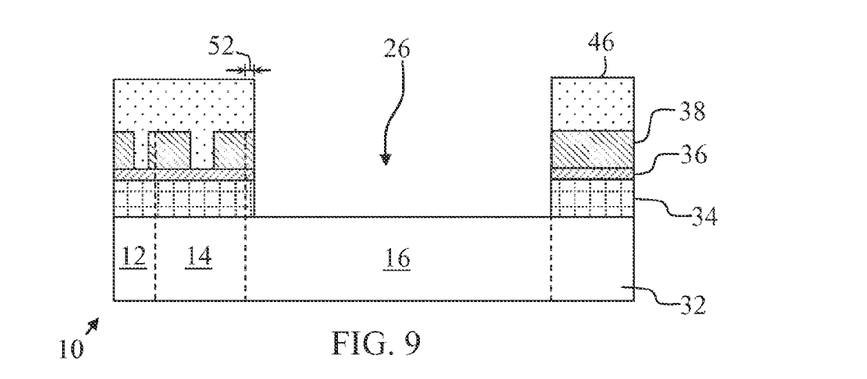
Figure 10:
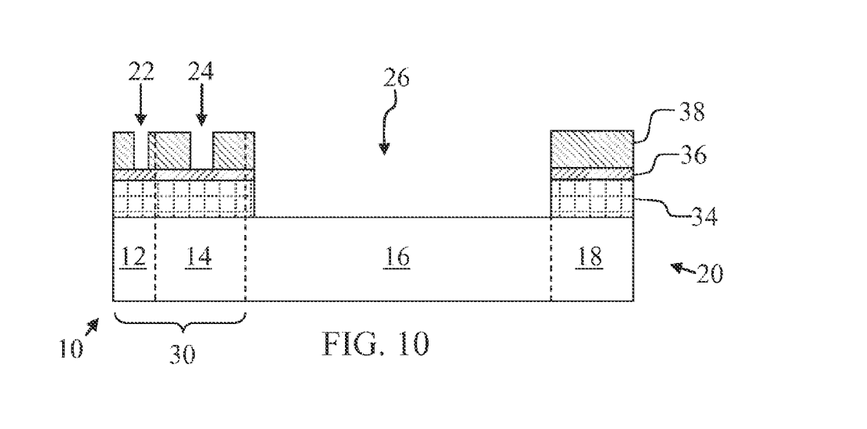

As shown in FIG. 8, after exposing the border region 48 of the photoresist 46 through the double patterning process illustrated in FIGS. 6 and 7, the exposed portions 50 and 58 are removed, such as by treatment with developing solution to form opening 60 within photoresist 46 and to expose a portion 62 of the photomask substrate 10, substantially equal to the border region 16. In FIG. 9, an anisotropic etching process, such as a plasma etch, is performed with the photoresist 46 as a mask to physically remove the exposed portion 62 of the absorber stack 38, capping layer 36 and reflector 34 to form the non-reflective border pattern 26. As shown, only the base substrate 32 remains in the border region 16 of the photomask substrate 10. Further, the non-reflective border pattern 26 is located a distance 52 from the scribe line region 14. In FIG. 10, the photoresist 46 is removed, such as by ashing, resulting in the completed structure of the EUV mask 20. The EUV mask 20 includes a non-reflective border pattern 26 etched through the absorber stack 38, capping layer 36 and reflector 34 in border region 16 and a product pattern 22 and service pattern 24 etched in the absorber stack 38 in the die pattern region 30.

FIGS. 11-19 are simplified cross-sectional views of EUV mask 20 of FIG. 4 at various stages of manufacture and illustrated in accordance with a second exemplary embodiment of an EUV mask fabrication process wherein a EUV non-reflective border is formed using a double patterning performed with two etch processes, i.e., a lithography-etch-lithography-etch (LELE) process.

Figure 11:
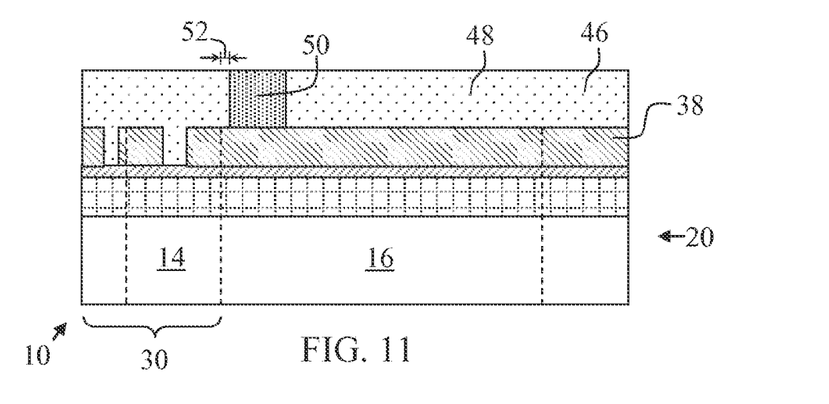
FIGS. 11-19 are simplified cross-sectional views illustrating processing of the photomask substrate of FIG. 4 at various stages of fabrication and illustrated in accordance with another exemplary embodiment of the EUV mask fabrication process wherein the non-reflective border region is formed with two etches in the border region.

With reference to FIG. 11, a photoresist 46 is formed over the upper surface of absorber stack 38 and includes a border region 48 overlying the border region 16 of the photomask substrate 10. As shown, photoresist 46 is selectively exposed using a precise exposure process, such as an electron beam lithography process. As a result, an exposed inner portion 50 is formed in the border region 48 of the photoresist 46. The precise exposure process provides for formation of the exposed inner portion 50 with a deviation of no more than about ±15 nm. As a result, the exposed inner portion 50 can be formed at a distance 52 from the scribe line region 16 or die pattern region 30 of no more than about 30 nm. In certain embodiments, the exposure process has a deviation of no more than about ±10 nm and the exposed inner portion 50 is formed a distance 52 from the die pattern region 30 of no more than about 20 nm.

Figure 12:
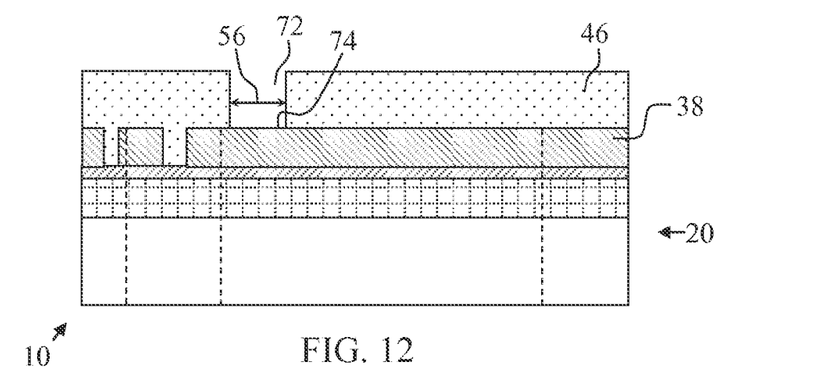
Figure 13:
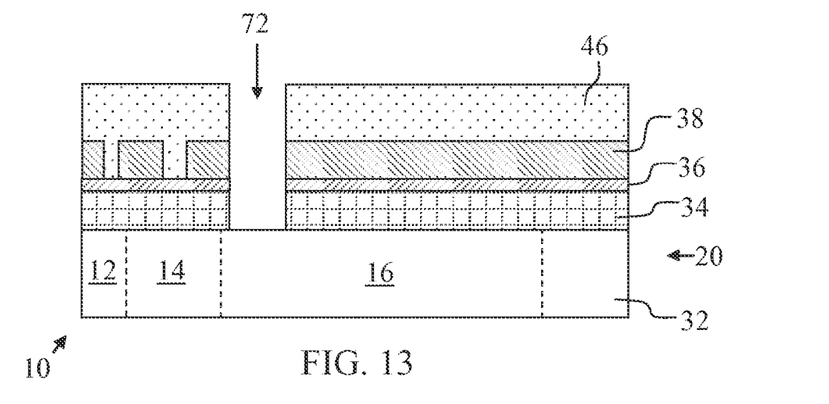
Figure 14:
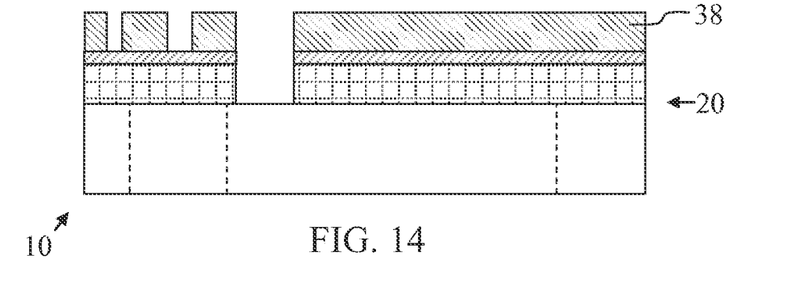

In FIG. 12, the exposed inner portion 50 is removed such as by treatment with a developing solution to form an inner pattern opening 72 within photoresist 46 and to expose a portion 74 of the photomask substrate 10, i.e., the absorber stack 38. As shown, the inner pattern opening 72 (and, accordingly, the inner portion 50 in FIG. 11) has a width 56. In an exemplary embodiment, the width 56 is at least about 60 nm. In FIG. 13, an anisotropic etching process, such as a plasma etch, is performed with the photoresist 46 as a mask to physically remove the portion 74 of the absorber stack 38, capping layer 36 and reflector 34 and to recess the inner pattern opening 72 to the base substrate 32. As shown, only the base substrate 32 remains beneath inner pattern opening 72 of the photomask substrate 10. In FIG. 14, the photoresist 46 is removed, such as by ashing, to expose the absorber stack 38.

Figure 15:
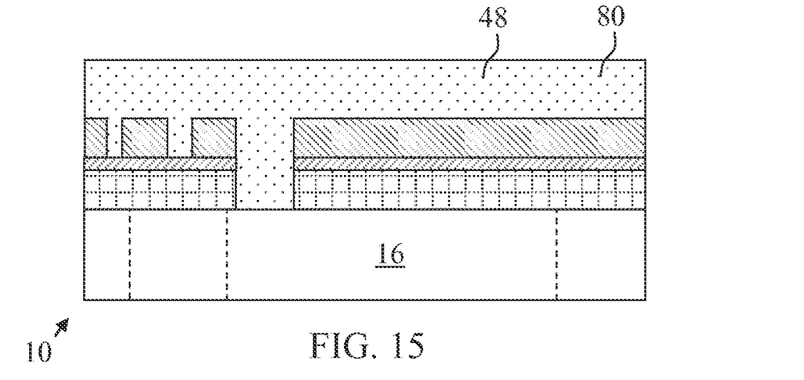
Figure 16:
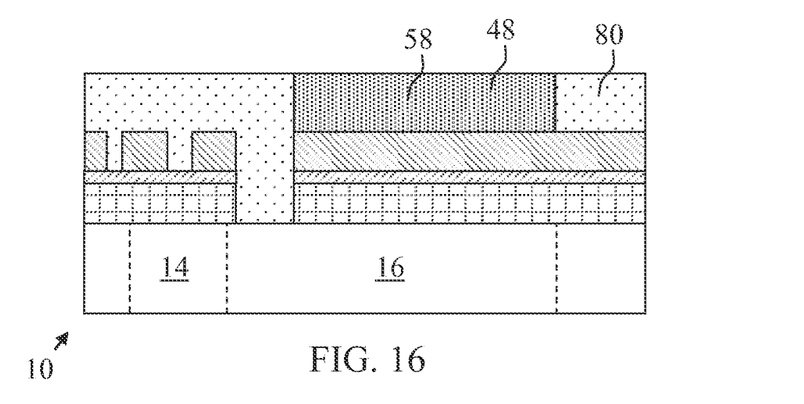

In FIG. 15, another photoresist 80 is formed over the photomask substrate 10. As shown, the photoresist 80 includes a border region 48 overlying the border region 16 of the photomask substrate 10. In FIG. 16, a second lithography process is performed to expose an outer portion 58 of the border region 48 of the photoresist 80. An exemplary lithography process is less precise than the process for exposing the inner portion, but is faster. For example, an optical lithography process, a direct laser writing lithography process, or a deep ultraviolet laser writing lithography process may be performed to expose the outer portion 58. Typically, the less precise lithography process has a deviation of about ±45 nm. The less precise process does not impact the positioning of the non-reflective border pattern to be formed relative to the scribe line region 14, as the outer portion 58 exposure overlaps with the inner portion.

Figure 17:
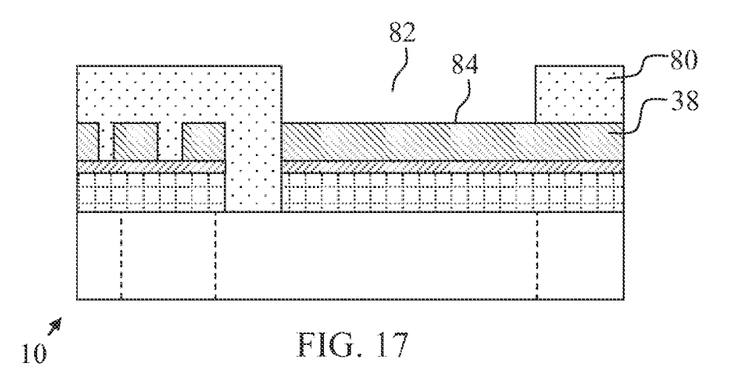
Figure 18:
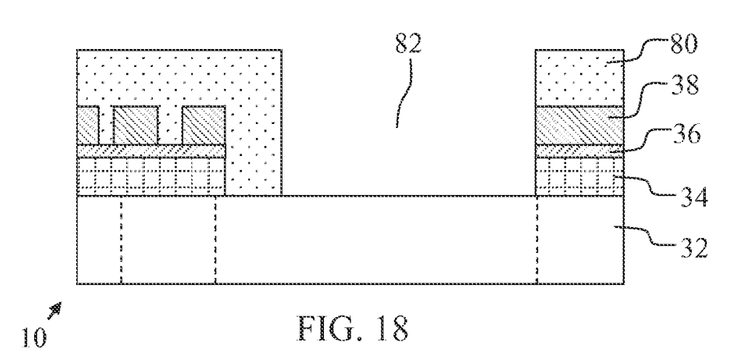

As shown in FIG. 17, after exposing the outer portion 58 of the border region 48 of the photoresist 80, the exposed outer portion 58 is removed, such as treatment with developing solution to form an outer pattern opening 82 within photoresist 80 and to expose a portion 84 of the photomask substrate 10, i.e., the absorber stack 38. In FIG. 18, an anisotropic etching process, such as a plasma etch, is performed with the photoresist 80 as a mask to physically remove the portion 84 of the absorber stack 38, capping layer 36 and reflector 34. As shown, only the base substrate 32 remains in the resulting outer pattern opening 82 of the photomask substrate 10. In FIG. 19, the photoresist 80 is removed, such as by ashing, resulting in the structure of the EUV mask 20.

As shown in FIG. 19, the embodiment of FIGS. 10-19 is completed and (similar to the embodiment of FIGS. 6-9) results in an EUV mask 20 with a product pattern 22 and service pattern 24 etched in the absorber stack 38 in the die pattern region 30 and a non-reflective border pattern 26 (the sum of openings 72 and 82) etched through the absorber stack 38, capping layer 36 and reflector 34 in border region 16. Specifically, substantially all of the reflector 34, capping layer 36, and absorber stack 38 are removed from the border region 16, leaving only the substantially non-reflective base substrate 32 in the border region 16. Further, through the use of a precise lithography process, such as electron beam lithography, the non-reflective border pattern 26 in the border region 16 is no more than 30 nm from the die pattern region 30 and has reduced deviation, providing improved performance during extreme lithography processing using the EUV mask.

It is noted that while in the embodiment of FIGS. 6-9 the inner portion of the border region of the photoresist was exposed before the outer portion of the border region was exposed, and in the embodiment of FIGS. 10-19 the inner portion of the border region of the photoresist was exposed and etched before the outer portion of the border region was exposed and etched, it is contemplated herein that the outer portion be exposed and processed first, followed by exposure and processing of the inner portion.

Referring now to FIGS. 20-21, a process for fabricating a portion of an integrated circuit using an EUV mask 20 and EUV lithography is illustrated. In FIG. 20, a partially-fabricated integrated circuit 90 is provided with a process layer 92 disposed over a semiconductor device 94. The term "process layer" is utilized herein to encompass dielectric layers, silicon layers, metal layers, and the like. A photoresist layer 96 is formed over the process layer. The photoresist layer 96 is then patterned by exposure to EUV light 98 reflected from the EUV mask 20. As described above, the EUV mask 20 includes a patterned absorber 38 in a die pattern region 30 and a non-reflective border pattern 26. As a result, reflection from the border region 16 of the EUV mask 20 is reduced and image resolution is improved at the edges of an exposure reflected from the EUV mask 20.

In FIG. 21, process layer 92 is etched with an etchant 99 while using the patterned photoresist layer 96 as a mask. Specifically, the portions of the process layer 92 exposed by the pattern photoresist layer 96 are removed. After etching the process layer 92, the photoresist layer 96 is removed, resulting in an integrated circuit 90 having critical dimensions reduced beyond the capacity of conventional lithography provided by utilizing the EUV mask and EUV lithography process.

To briefly summarize, the methods for fabricating EUV masks and methods for fabricating integrated circuits using EUV masks described herein utilize a non-reflective border pattern formed by a double lithography process. The non-reflective border pattern is provided with increased precision, particularly in relation to the distance of the non-reflective border pattern from the die pattern region. With increased precision of the non-reflective border pattern, lithography processes using the EUV masks are improved.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application

What is claimed is:

1. A method for fabricating a portion of an integrated circuit, the method comprising:
   fabricating an extreme ultraviolet (EUV) mask comprising:
      providing a photomask substrate having a border region;
      forming a first photoresist over the photomask substrate, the first photoresist having a border region overlying the border region of the photomask substrate;
      exposing an inner portion of the border region of the first photoresist;
      exposing an outer portion of the border region of the first photoresist;
      removing the inner portion of the border region of the first photoresist and removing the outer portion of the border region of the first photoresist to expose the border region of the photomask substrate;
      etching the border region of the photomask substrate using the first photoresist as a mask to form the EUV mask with a non-reflective border; and
      removing the first photoresist from the EUV mask;
   forming a second photoresist over a layer of a partially-fabricated integrated circuit;
   patterning the second photoresist by exposure to EUV light reflected from the EUV mask to expose portions of the layer of the partially-fabricated integrated circuit;
   removing the portions of the layer of the partially-fabricated integrated circuit; and
   removing the second photoresist.

2. The method of claim 1 wherein providing a photomask substrate comprises providing a photomask substrate having a scribe line region surrounded by the border region and a product region surrounded by the scribe line region; the method further comprising patterning the photomask substrate to form a product pattern in the product region and a service pattern in the scribe line region.

3. The method of claim 2 wherein exposing an inner portion of the border region of the first photoresist comprises forming an exposed region no more than 30 nanometers (nm) from the scribe line region.

4. The method of claim 2 wherein exposing an inner portion of the border region of the first photoresist comprises forming an exposed region no more than 20 nanometers (nm) from the scribe line region.

5. The method of claim 1 wherein exposing an inner portion of the border region of the first photoresist comprises forming an exposed region having a width of at least about 60 nanometers (nm).

6. The method of claim 1 wherein exposing an inner portion of the border region of the first photoresist comprises performing an electron beam lithography process.

7. The method of claim 2 wherein exposing an outer portion of the border region of the first photoresist comprises performing an optical lithography process.

8. The method of claim 2 wherein exposing an outer portion of the border region of the first photoresist comprises performing a direct laser writing lithography process.

9. The method of claim 2 wherein exposing an outer portion of the border region of the first photoresist comprises performing a deep ultraviolet laser writing lithography process.

10. The method of claim 1 wherein exposing an outer portion of the border region of the first photoresist comprises exposing an outer portion of the border region of the first photoresist after exposing an inner portion of the border region of the first photoresist.

11. The method of claim 10 wherein removing the inner portion of the border region of the first photoresist and removing the outer portion of the border region of the first photoresist to expose the border region of the photomask substrate comprises:
   removing the inner portion of the border region of the first photoresist before exposing an outer portion of the border region of the first photoresist; and
   removing the outer portion of the border region of the first photoresist after exposing an outer portion of the border region of the first photoresist.

12. The method of claim 10 wherein removing the inner portion of the border region of the first photoresist and removing the outer portion of the border region of the first photoresist to expose the border region of the photomask substrate comprises simultaneously removing the inner portion of the border region of the first photoresist and the outer portion of the border region of the first photoresist.

13. The method of claim 1 wherein providing a photomask substrate comprises providing a photomask substrate having a scribe line region surrounded by the border region and a product region surrounded by the scribe line region and including a base substrate, a reflector layer overlying the base substrate, a capping layer overlying the reflector layer, and an absorber layer overlying the capping layer; wherein etching the border region of the photomask substrate comprises etching the absorber layer, the capping layer, and the reflector layer in the border region of the photomask substrate; and wherein the method further comprises patterning the absorber layer in the photomask substrate to form a product pattern in the product region and a service pattern in the scribe line region.

14. The method of claim 1 further comprising:
   removing the first photoresist after etching a portion of the border region; and
   forming a third photoresist over the photomask substrate, the third photoresist having a border region overlying the border region of the photomask substrate; wherein:
   exposing an outer portion of the border region of the first photoresist comprises exposing an outer portion of the border region of the third photoresist; removing the outer portion of the border region of the first photoresist comprises removing the outer portion of the border region of the third photoresist; and etching the border region of the photomask substrate using the first photoresist as a mask comprises etching a portion of the border region underlying the outer portion of the border region of the third photoresist using the third photoresist as a mask.

15. A method for fabricating an EUV mask, the method comprising:
   providing a photomask substrate having a border region;
   forming a first photoresist over the photomask substrate, the first photoresist having a border region overlying the border region of the photomask substrate;
   removing a first portion of the border region of the first photoresist to expose a first portion of the border region of the photomask substrate;
   etching the first portion of the border region of the photomask substrate using the first photoresist as a mask;
   removing a remaining portion of the first photoresist;
   forming a second photoresist over the photomask substrate, the second photoresist having a border region overlying the border region of the photomask substrate;
   removing a second portion of the border region of the second photoresist to expose a second portion of the border region of the photomask substrate;
   etching the second portion of the border region of the photomask substrate using the second photoresist as a mask; and
   removing a remaining portion of the second photoresist.

16. The method of claim 15 wherein the first portion of the border region of the first photoresist is an inner portion, and wherein removing the first portion of the border region of the first photoresist comprises exposing the inner portion of the border region of the first photoresist by performing an electron beam lithography process.

17. The method of claim 15 wherein the second portion of the border region of the second photoresist is an inner portion, and wherein removing the second portion of the border region of the second photoresist comprises exposing the inner portion of the border region of the second photoresist by performing an electron beam lithography process.

18. A method for fabricating an EUV mask, the method comprising:
   providing a photomask substrate having a border region adjacent a die pattern region;
   forming a photoresist over the photomask substrate, the photoresist having a border region overlying the border region of the photomask substrate;
   exposing an inner portion of the border region of the photoresist to form an exposed portion no more than 30 nanometers (nm) from the die pattern region;
   exposing an outer portion of the border region of the photoresist;
   removing the inner portion of the border region of the photoresist and removing the outer portion of the border region of the photoresist to expose the border region of the photomask substrate;
   etching the border region of the photomask substrate using the photoresist as a mask to form the EUV mask with a non-reflective border no more than 30 nm from the die pattern region; and
   removing the photoresist from the photomask substrate.

19. The method of claim 18 wherein exposing an inner portion of the border region of the photoresist comprises performing an electron beam lithography process.

20. The method of claim 18 wherein exposing an inner portion of the border region of the photoresist comprises performing an electron beam lithography process and exposing an inner portion having a width of at least about 60 nanometers (nm).

* * * * *